(12) United States Patent
Kim

(10) Patent No.: US 7,615,320 B2
(45) Date of Patent: Nov. 10, 2009

(54) METHOD FOR FABRICATING COLOR FILLER SUBSTRATE

(75) Inventor: Young Seok Kim, Kunpo-si (KR)

(73) Assignee: LG Display Co., Ltd., Seoul (KR)

( * ) Notice: Subject to any disclaimer, the term of this patent is extended or adjusted under 35 U.S.C. 154(b) by 530 days.

(21) Appl. No.: 11/095,539

(22) Filed: Apr. 1, 2005

(65) Prior Publication Data

US 2005/0221205 A1  Oct. 6, 2005

(51) Int. Cl.
*G02B 5/20* (2006.01)
(52) U.S. Cl. .......................................... 430/7; 430/394
(58) Field of Classification Search ........................ None
See application file for complete search history.

(56) References Cited

U.S. PATENT DOCUMENTS 5,462,822 A * 10/1995 Roosen et al. .................. 430/7
5,800,953 A * 9/1998 Mizukawa et al. ............. 430/7

FOREIGN PATENT DOCUMENTS

JP         60-221728 A    * 11/1985

* cited by examiner

*Primary Examiner*—John A. McPherson
(74) *Attorney, Agent, or Firm*—McKenna Long & Aldridge LLP

(57) ABSTRACT

A method for fabricating a color filter substrate is disclosed, to realize the simplified fabrication process by forming a film-type color filter layer, which includes preparing a mask having patterns for forming color filter layers and a black matrix layer; positioning the mask above a film; irradiating light to the film through the mask; developing the film to form the film-type color filter layers and the black matrix layer; and adhering the developed film onto a substrate.

9 Claims, 7 Drawing Sheets

METHOD FOR FABRICATING COLOR FILLER SUBSTRATE

This application claims the benefit of the Korean Application No. P2003-68812 filed on Oct. 2, 2003, which is hereby incorporated by reference.

BACKGROUND OF THE INVENTION

1. Field of the Invention

The present invention relates to a method for fabricating a liquid crystal display (LCD) device, and more particularly, to a method for fabricating a color filter substrate.

2. Discussion of the Related Art

With the recent development in display devices of advanced technology and skills such as high definition televisions, various flat display devices have been actively researched, for example, liquid crystal displays (LCD), electroluminescence displays (ELD), vacuum fluorescent displays (VFD), and plasma display panels (PDP), which can substitute for cathode ray tubes (CRT).

Among the various flat display devices, the LCD device has been most widely used due to the advantageous characteristics of thin profile, lightness in weight, and low power consumption. Accordingly, the LCD devices are used for a mobile-mounting type monitor and a monitor of a color television as well as a laptop computer and a pocket computer.

The LCD device having the aforementioned characteristics includes an upper substrate of a color filter array substrate, a lower substrate of a thin film transistor TFT array substrate, and a liquid crystal layer. At this time, the liquid crystal layer is formed between the lower and upper substrates, wherein the liquid crystal layer has the dielectric anisotropy.

In more detail, the color filter substrate is comprised of a color filter layer having red R, green G and blue B color filter patterns, a black matrix layer, and a common electrode. At this time, color filter layer has the R, G and B patterns arranged in order, to represent various colors. Then, the black matrix layer divides R, G and B cells, and prevents light from being incident on predetermined portions of the color filter substrate. Also, the common electrode provides a voltage to a liquid crystal cell. As the R, G and B patterns of the color filter layer are driven seperately, the color of one pixel is represented by combination of the three R, G and B patterns.

Hereinafter, a method for fabricating a color filter substrate according to the related art will be described with reference to the accompanying drawings.

FIG. 1A to FIG. 1G are cross sectional views of the process for fabricating a color filter substrate according to the related art.

First, after cleaning a glass substrate 11, as shown in FIG. 1A, a metal thin layer of chrom Cr, having an optical density OD of 3.5 or more, or an organic layer of carbon type is deposited on the glass substrate, and patterned by photolithography, thereby forming a black matrix 13.

The black matrix 13 is formed in correspondence with an edge of a unit pixel region, and an area for forming a thin film transistor TFT, thereby preventing light from leaking through the edge of the unit pixel region and the area for forming the thin film transistor TFT, which have a relatively unstable electric field.

After forming the black matrix 13, a color resist is coated on an entire surface of the glass substrate 11 including the black matrix 13, to represent various colors. That is, a first color resist 14a of a red color is coated to completely cover the entire surface of the black matrix 13.

Subsequently, as shown in FIG. 1B, after masking predetermined portions of the first color resist 14a with light-shielding parts of a mask 17, ultraviolet rays are irradiated thereon, thereby partially exposing the first color resist 14a.

Next, as shown in FIG. 1C, the first color resist 14a, having a changed photochemical structure by exposure, is cured at a high temperature of about 230° C., and then is dipped into a developing solution, thereby forming a first color pattern 15a of red color. At this time, the developing process may be performed in any one of dipping, puddle and shower spraying.

As shown in FIG. 1D, a second color resist 14b of a green color is coated on the entire surface of the glass substrate having the first color pattern 15a of red color. Then, after masking predetermined portions of the second color resist 14b with the light-shielding parts of the mask 17, ultraviolet rays are irradiated thereon, thereby partially exposing the second color resist 14b. At this time, the mask 17 is the same one used when exposing the first color resist 14a. That is, after exposing the first color resist 14a, the mask 17 is shifted to expose the second color resist 14b.

The second color resist 14b, having a changed photochemical structure by exposure, is developed, as shown in FIG. 1E, thereby forming a second color pattern 15b of green color.

The second color pattern 15b is formed in one pixel region adjacent to another pixel region having the first color pattern 15a, wherein the black matrix 13 is formed between the two pixel regions of the first color pattern 15a and the second color pattern 15b.

Subsequently, a third color resist 14c of a blue color is coated on the entire surface of the glass substrate including the second color pattern 15b. Then, after masking predetermined portions of the third color resist 14c with the light-shielding parts of the mask 17, ultraviolet rays are irradiated thereon, thereby partially exposing the third color resist 14c. At this time, the mask 17 is the same one-used when exposing the first and second color resists 14a and 14b. That is, after exposing the first and second color resists 14a and 14b, the mask 17 is shifter to expose the third color resist 14c.

The third color resist 14c, having a changed photochemical structure by exposure, is developed, as shown in FIG. 1F, thereby forming a third color pattern 15c of blue color.

The third color pattern 15c is formed in one pixel region adjacent to another pixel region having the second color pattern 15b, wherein the black matrix 13 is formed between the two pixel regions of the second color pattern 15b and the third color pattern 15c, thereby completing a color filter layer 15 of R, G and B patterns.

Generally, the color filter layer 115 is formed in order of R, G and B patterns.

After that, as shown in FIG. 1G, a planarization layer is coated on the entire surface of the glass substrate including the color filter layer 15, to protect the color filter layer 15 and to planarize the entire surface of the color filter layer 15, thereby forming an overcoat layer 16. At this time, the planarization layer is formed in a method of coating acrylic resin or polyimide-type resin by spin coating.

Then, a transparent electrode material such as ITO (Indium-Tin-Oxide), having great transmittance, high conductivity and stable chemical and thermal characteristics, is deposited on the overcoat layer 16 by sputtering, thereby forming a common electrode 18. When forming the common electrode 18, it is unnecessary to perform an additional patterning process. The common electrode 18 drives a liquid crystal cell with a pixel electrode formed on a TFT array substrate.

Accordingly, it is possible to complete a color filter substrate having the black matrix 13, the color filter layer 15, the overcoat layer 16 and the common electrode 18.

For reference, in case of an In-Plane Switching (IPS) mode LCD device, a common electrode is formed on a TFT array substrate, and a black matrix, a color filter layer and an overcoat layer are formed on a color filter substrate.

However, the method for fabricating the color filter substrate according to the related art has the following disadvantages.

In case of the method for fabricating the color filter substrate according to the related art, it is necessary to change the color resist by R, G and B, in order to change the chromatic coordinates of the color filter layer. That is, the patterning process for forming the R, G and B patterns is performed several times. In addition, the overcoat layer is additionally formed to planarize the irregular color filter layer. Accordingly, the fabrication process is complicated, and the fabrication time increases.

SUMMARY OF THE INVENTION

Accordingly, the present invention is directed to a method for fabricating a color filter substrate that substantially obviates one or more problems due to limitations and disadvantages of the related art.

An object of the present invention is to provide a method for fabricating a color filter substrate, to realize the simplified fabrication process by forming a film-type color filter layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating a color filter substrate includes preparing a mask having patterns for forming color filter layers and a black matrix layer; positioning the mask above a film, and irradiating light to the film through the mask; developing the film to form the film-type color filter layers and the black matrix layer; and adhering the developed film onto a substrate.

In another aspect, a method for fabricating a color filter substrate includes adhering a film onto a substrate; preparing a mask having patterns for forming color filter layers and a black matrix layer; positioning the mask above the film, and irradiating light to the film through the mask; and developing the film to form the film-type color filter layers and the black matrix layer.

In another aspect, a method for fabricating a color filter substrate includes preparing a mask having a light-transmitting part and a light-shielding part; positioning the mask above a film; irradiating visible rays of a first wavelength onto the film through the light-transmitting part of the mask; shifting the mask; irradiating visible rays of a second wavelength onto the film through the light-transmitting part of the mask; shifting the mask; irradiating visible rays of a third wavelength onto the film through the light-transmitting part of the mask; and forming film-type color filter layers by developing the film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method for fabricating a color filter substrate according to the preferred embodiments of the present invention will be described with reference to the accompanying drawings.

FIRST EMBODIMENT

Figure 1A:
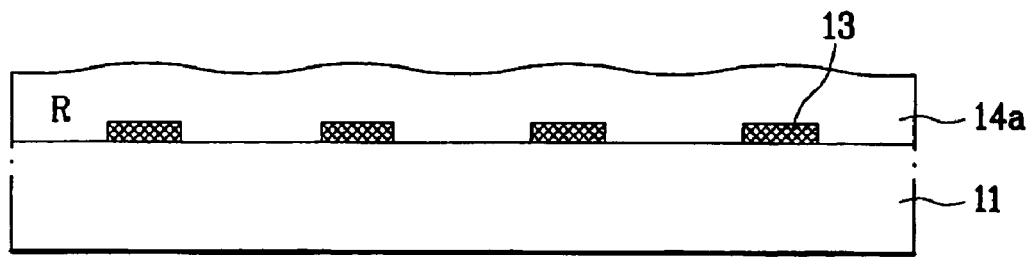
FIG. 1A to FIG. 1G are cross sectional views of the process for fabricating a color filter substrate according to the related art.
Figure 1B:
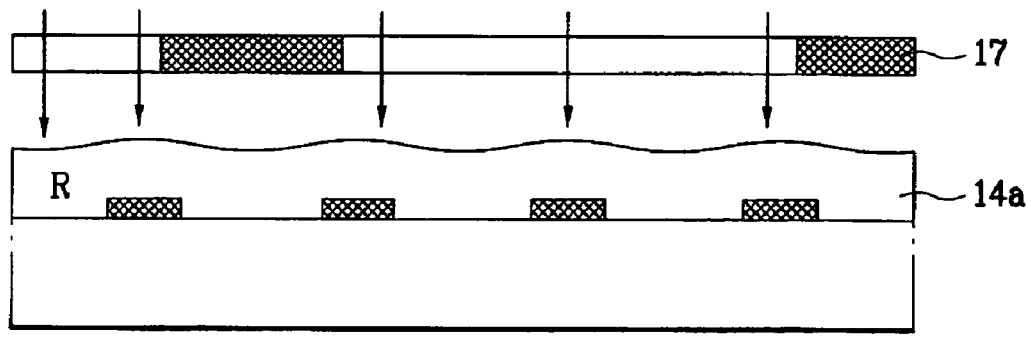
Figure 1C:
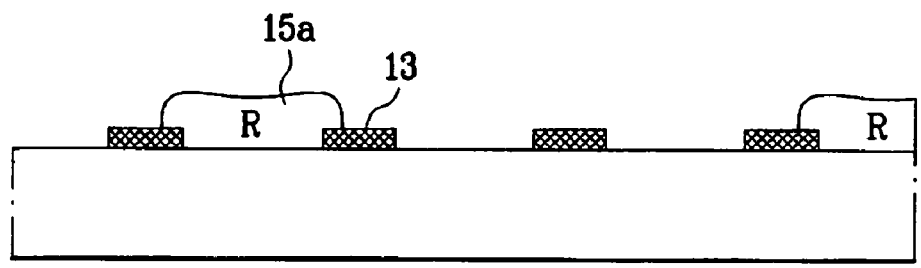
Figure 1D:
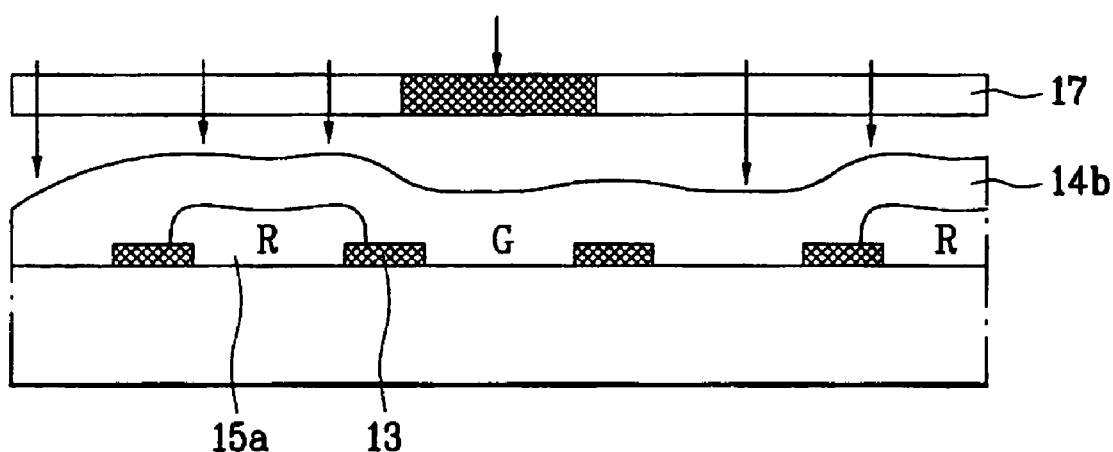
Figure 1E:
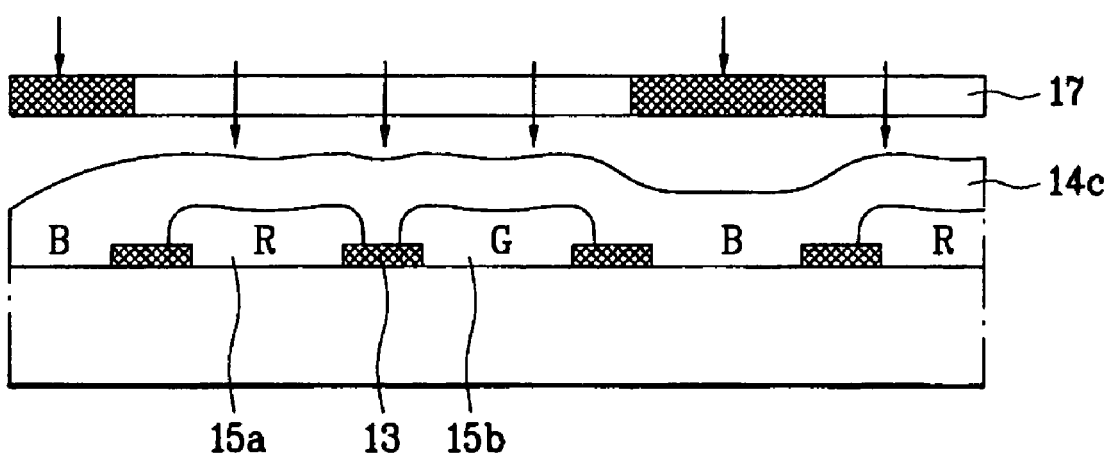
Figure 1F:
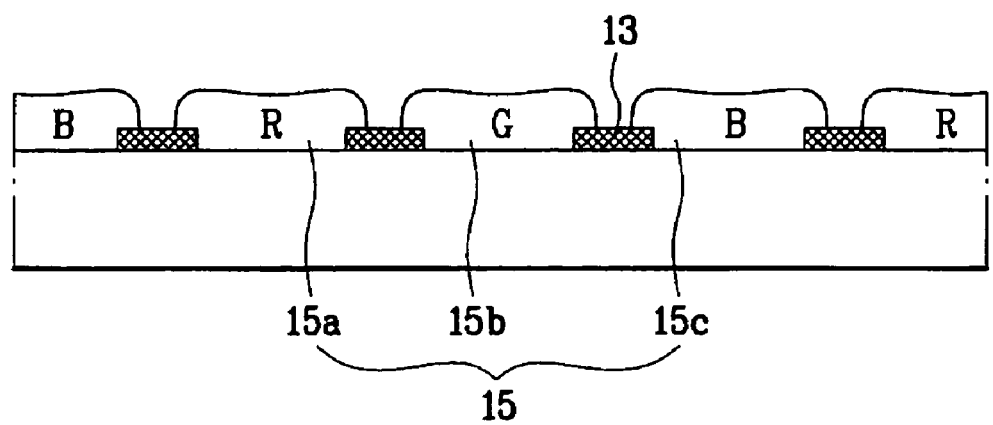
Figure 1G:
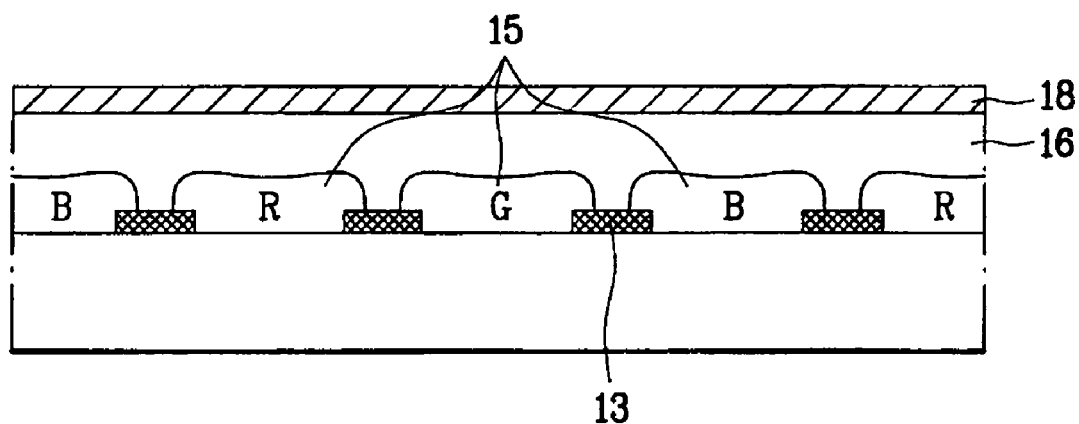
Figure 2A:
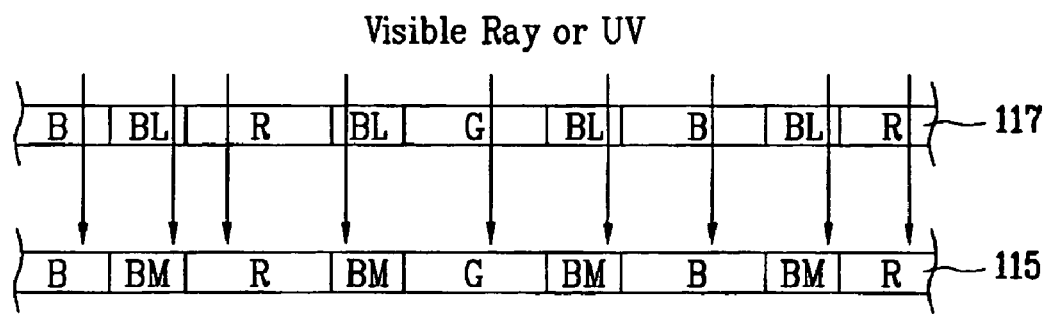
FIG. 2A and FIG. 2B are cross sectional views of the process for fabricating a color filter substrate according to the first embodiment of the present invention.
Figure 2B:
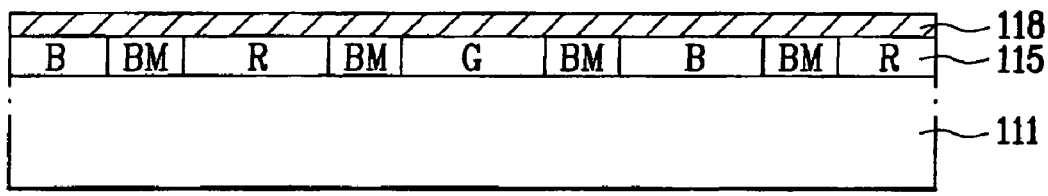

FIG. 2A and FIG. 2B are cross sectional views of the process for fabricating a color filter substrate according to the first embodiment of the present invention.

First, as shown in FIG. 2A, a mask 117 is positioned above a film 115, and then light is irradiated onto the film 115 through the mask 117, thereby exposing the film 115 with the same pattern as the mask 117. Herein, the film 115 is formed of a photosensitive material.

At this time, the mask 117 has a transparent substrate (not shown), a black pattern BL on the transparent substrate except a pixel region, and red R, green G and blue B patterns on the transparent substrate corresponding to the pixel region.

By one exposure process of using the mask 117, it is possible to form a black matrix layer BM and R, G and B color filter layers at the same time. The exposure process may use visible rays and ultraviolet rays. That is, when light is irradiated to the mask 117, R, G, B and BL colors are emitted to corresponding areas of R, G, B and BL on the mask 115.

On completion of a development process, the exposed film 115 has the black matrix layer BM and the R, G and B color filter layers in the same pattern as the mask 117. Accordingly, the black matrix layer BM substitutes for a related art black matrix, so that the fabrication process is simplified. In addition, it is possible to prevent misalignment between the black matrix layer and the color filter layer, or to prevent misalignment of the R, G and B patterns of the color filter layer, whereby it is unnecessary to perform a compensation process.

In case of using the aforementioned mask 117, it is easy to form the color filter layer having a particular pattern. That is, since the mask of having the particular pattern is positioned above the film, and the particular pattern is printed onto the film, it is unnecessary to perform a complicated mask fabrication process according to the related art.

Accordingly, the film-type color filter layer is completed. In the related art, in order to change the chromatic coordinates, there is a requirement for changing color resists. However, in case of the present invention, a process for changing the chromatic coordinates is unnecessary, thereby simplifying the fabrication process.

In the meantime, the film 115 has the positive characteristics, whereby the pattern having the same colors as those of the mask pattern is formed on the film 115. At this time, if the film 115 has the negative characteristics, the pattern having the opposite colors as those of the mask pattern, complementary colors, is formed on the film 115.

Furthermore, in case of the related art, there is a requirement for performing a curing process before developing the exposed color resists. In the present invention, since the film-type color filter layer is not fabricated at a high temperature, substrates may be formed of various materials such as plastic, as well as glass.

As shown in FIG. 2B, the developed film 115 is adhered on a transparent substrate 111 by tape. Then, a common electrode 118 is formed on the film 115, wherein the common electrode 118 is formed in a method of depositing a transparent electrode material such as ITO (Indium-Tin-Oxide) or IZO (Indium-Zinc-Oxide), having great transmittance, high conductivity and stable chemical and thermal characteristics, by sputtering. At this time, the common electrode 118 of the color filter substrate and a pixel electrode of a TFT array substrate drive liquid crystal cells.

Also, it is unnecessary to form an additional overcoat layer since the film-type color filter layer has a flat surface, thereby decreasing the fabrication cost.

Herein, instead of adhering the film 115 on the transparent substrate 111 by tape, it is possible to print the pattern of the mask on the film 115 after adhering the film 115 on the transparent substrate 111.

As a result, it is possible to complete the color filter substrate having the film-type color filter layer and the common electrode, according to the first embodiment of the present invention.

SECOND EMBODIMENT

Figure 3A:
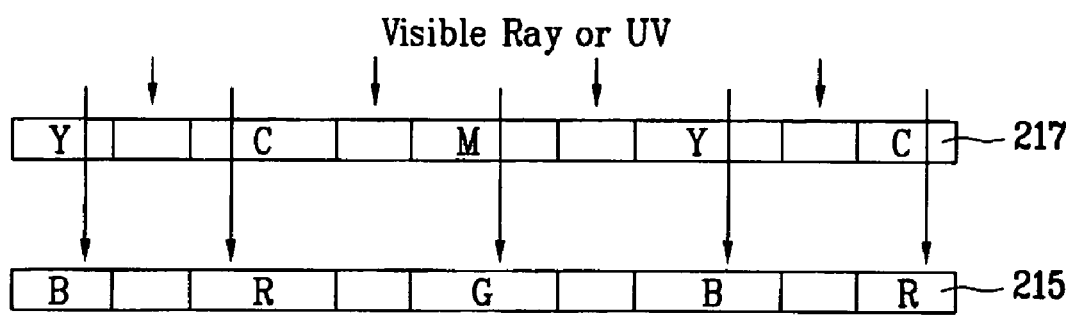
FIG. 3A and FIG. 3B are cross sectional views of the process for fabricating a color substrate according to the second embodiment of the present invention.
Figure 3B:
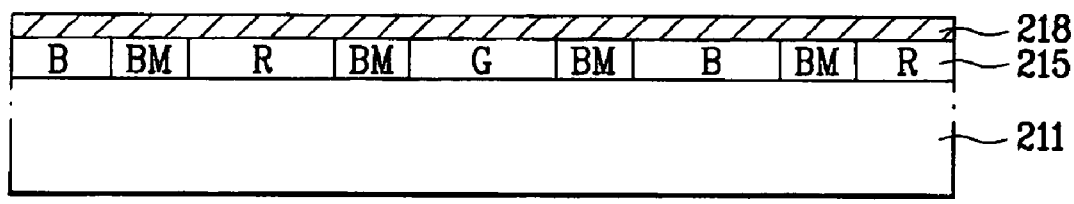

FIG. 3A and FIG. 3B are cross sectional views of the process for fabricating a color filter substrate according to the second embodiment of the present invention.

First, as shown in FIG. 3A, a mask 217 is positioned above a film 215, and then light is irradiated onto the film 215 through the mask 217, thereby exposing the film 215 with the same pattern as the mask 217. Herein, the film 215 is formed of a photosensitive material.

At this time, the film 215 has the negative characteristics, whereby the pattern having the opposite colors as those of the mask pattern, that is, complementary colors, is formed on the film 215. In this case, in order to perform an exposure process, visible rays as well as ultraviolet rays may be used.

At this time, the mask 217 is provided with a light-shielding area having no color therein, and cyan C, magenta M and yellow Y patterns, wherein the light-shielding area corresponds to the edge of unit pixel region, and the C, M and Y patterns correspond to the respective pixel regions between the light-shielding areas. At this time, the light-shielding layer is expressed as a black color on the developed negative film.

By one exposure process of using the mask 217, it is possible to form a black matrix layer BM and R, G and B color filter layers at the same time. As light is irradiated to the mask 217, C, M and Y colors are emitted to corresponding areas of C, M and Y on the mask 215.

On completion of a development process, the exposed film 215 has the black matrix layer BM and the R, G and B color filter layers. That is, the R, G and B color filter layers are formed with the complementary colors of C, M and Y, and the black matrix layer BM is formed with the masked area of the light-shielding area. Accordingly, the fabrication process is simplified since there is no requirement for performing a process for fabricating an additional black matrix.

In addition, it is possible to prevent misalignment between the black matrix layer and the color filter layer, or to prevent misalignment of the R, G and B patterns of the color filter layer, whereby it is unnecessary to perform a compensation process.

Accordingly, the film-type color filter layer is completed. In the related art, in order to change the chromatic coordinates, there is a requirement for changing color resists. However, in case of the present invention, a process for changing the chromatic coordinates is unnecessary, thereby simplifying the fabrication process.

Furthermore, in case of the related art, there is a requirement for performing a curing process before developing the exposed color resists. In the present invention, since the film-type color filter layer is not fabricated at a high temperature, substrates may be formed of various materials such as plastic, as well as glass.

As shown in FIG. 3B, the developed film 215 is adhered on a transparent substrate 211 by tape. Then, a common electrode 218 is formed on the film 215, wherein the common electrode 218 is formed in a method of depositing a transparent electrode material such as ITO (Indium-Tin-Oxide) or IZO (Indium-Zinc-Oxide), having great transmittance, high conductivity and stable chemical and thermal characteristics by sputtering. At this time, the common electrode 218 of the color filter substrate and a pixel electrode of a TFT array substrate drive liquid crystal cells.

Also, it is unnecessary to form an additional overcoat layer since the film-type color filter layer has a flat surface, thereby decreasing the fabrication cost.

Herein, instead of adhering the film 215 on the transparent substrate 211 by tape, it is possible to print the pattern of the mask on the film 215 after adhering the film 215 on the transparent substrate 211.

As a result, it is possible to complete the color filter substrate having the film-type color filter layer and the common electrode, according to the second embodiment of the present invention.

THIRD EMBODIMENT

Figure 4A:
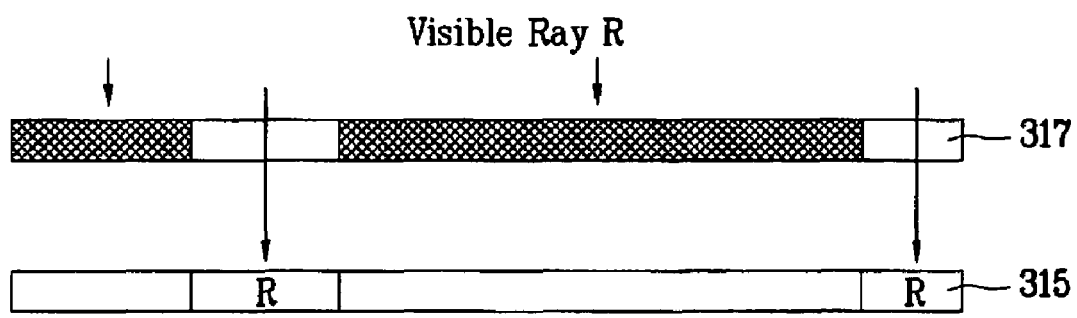
FIG. 4A and FIG. 4D are cross sectional views of the process for fabricating a color filter substrate according to the third embodiment of the present invention.
Figure 4B:
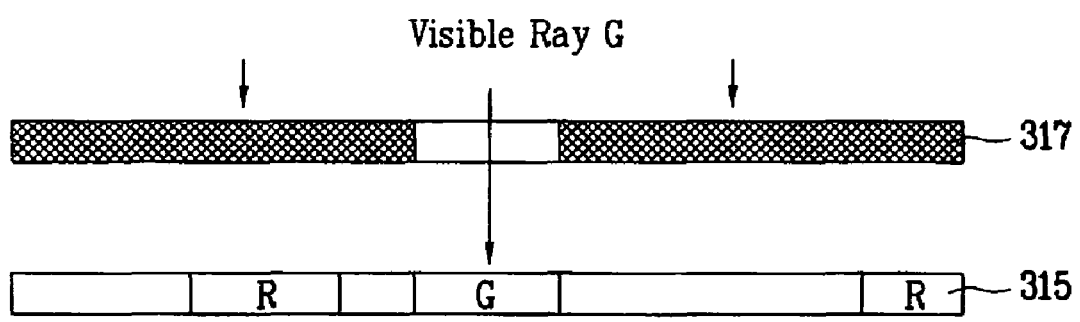
Figure 4C:
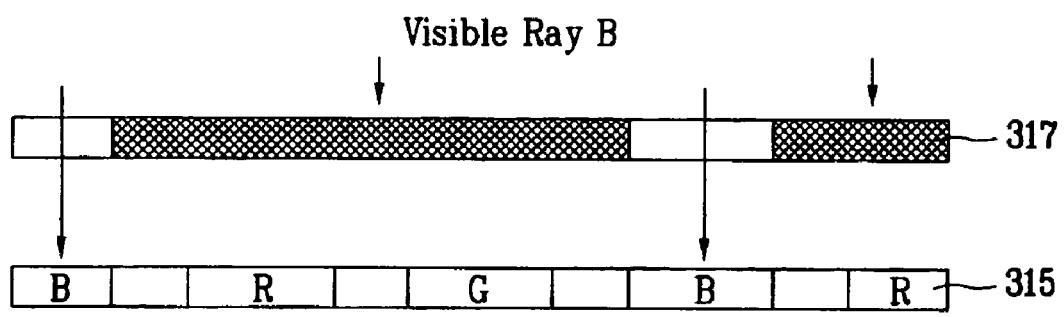
Figure 4D:
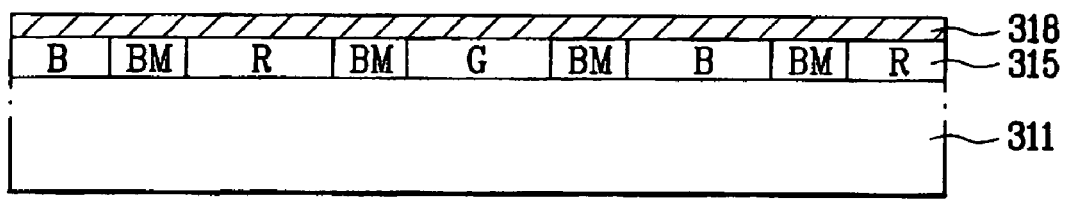

FIG. 4A and FIG. 4D are cross sectional views of the process for fabricating a color filter substrate according to the third embodiment of the present invention.

First, as shown in FIG. 4A, a mask 317 is positioned above a film 315. Then, in state a predetermined portion of the film 315 for forming a red color is exposed, visible rays of red color are irradiated to the predetermined portion of the film 315 for forming the red color, whereby a pattern of the red color is formed on the predetermined portion of the film 315. Herein, the film 315 is formed of a photosensitive material.

Next, as shown in FIG. 4B, the mask 317 is shifted to a predetermined portion of the film 315 for forming a green color. In state the predetermined portion of the film 315 for forming the green color is exposed, visible rays of green color are irradiated to the predetermined portion for the green color on the film 315, whereby a pattern of the green color is formed on the predetermined portion of the film 315.

After that, as shown in FIG. 4C, the mask 317 is shifted to a predetermined portion of the film 315 for forming a blue color. In state the predetermined portion of the film 315 for forming the blue color is exposed, visible rays of blue color are irradiated to the predetermined portion for the blue color on the film 315, whereby a pattern of the blue color is formed on the predetermined portion of the film 315.

At this time, since there is a requirement for using the visible rays having particular colors, the light having particular wavelengths is used in the aforementioned process. Except the case of using the ultraviolet rays with the visible rays, it is impossible to use the ultraviolet rays since the ultraviolet rays cannot represent the colors.

Subsequently, as developing the film 315 having the patterns of R, G and B thereon, it is possible to form the film-type color filter layer having the R, G and B patterns.

Generally, the patterns formed on the film 315 are in order of R, G and B. Also, the area formed between each of the R, G and B patterns, on which the light is not irradiated, is formed of a black matrix layer BM. Accordingly, it is unnecessary to perform an addition process for forming the black matrix layer, thereby simplifying the fabrication process.

In addition, it is possible to prevent misalignment between the black matrix layer and the color filter layer, or to prevent misalignment of the R, G and B patterns of the color filter layer, whereby it is unnecessary to perform a compensation process.

In the meantime, the film 315 has the positive characteristics, whereby the pattern having the same colors as those of the mask pattern is formed on the film 315. At this time, if the film 315 has the negative characteristics, it is possible to form the R, G and B patterns by irradiating the visible rays of cyan C, magenta M and yellow Y, complementary colors of the R, G and B, on the film 315.

Furthermore, in case of the related art, there is a requirement for performing a curing process before developing the exposed color resists. In the present invention, since the film-type color filter layer is not fabricated at a high temperature, substrates may be formed of various materials such as plastic, as well as glass.

As shown in FIG. 4B, the developed film 315 is adhered on a transparent substrate 311 by tape. Then, a common electrode 118 is formed on the film 315, wherein the common electrode 318 is formed in a method of depositing a transparent electrode material such as ITO (Indium-Tin-Oxide) or IZO (Indium-Zinc-Oxide), having great transmittance, high conductively and stable chemical and thermal characteristics by sputtering. At this time, the common electrode 318 of the color filter substrate and a pixel electrode of a TFT array substrate drive liquid crystal cells.

Also, it is unnecessary to form an additional overcoat layer since the film-type color filter layer has a flat surface, thereby decreasing the fabrication cost.

Herein, instead of adhering the film 315 on the transparent substrate 311 by tape, it is possible to print the pattern of the mask on the film 315 after adhering the film 315 on the transparent substrate 311.

As a result, it is possible to complete the color filter substrate having the film-type color filter layer and the common electrode, according to the third embodiment of the present invention.

As mentioned above, the method for fabricating the color filter substrate according to the preferred embodiments of the present invention has the following advantages.

First, in order to perform the exposure process, visible rays as well as ultraviolet rays may be used.

Also, the black pattern BL of the film-type color filter layer substitutes for the related art black matrix layer, whereby it is unnecessary to form the additional black matrix layer, thereby simplifying the fabrication process.

In addition, it is possible to prevent misalignment between the black matrix layer and the color filter layer, or to prevent misalignment of the R, G and B patterns of the color filter layer, whereby it is unnecessary to perform the compensation process.

In the related art, in order to change the chromatic coordinates, there is a requirement for changing color resists. However, in case of the present invention, the process for changing the chromatic coordinates is unnecessary, thereby simplifying the fabrication process.

In the method for fabricating the color filter substrate according to the present invention, the pattern of the mask is printed on the film, so that it is easy to form the color filter layer having the particular pattern.

In the present invention, since the film-type color filter layer is not fabricated at a high temperature, substrates may be formed of various materials such as plastic, as well as glass.

Also, there is no requirement for forming the additional overcoat layer since the film-type color filter layer has the flat surface, thereby decreasing the fabrication cost.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating a color filter substrate comprising:
    preparing a mask having a first exposure part, a second exposure part and a third exposure part;
    positioning the mask above a film, wherein the film is horizontally divided into four region that a first region, a second region, a third region and a fourth region;
    forming a first image in the first region by irradiating visible rays of a first wavelength onto the first region of the film through the first exposure part of the mask and by shifting the second exposure part and the third exposure part of the mask;
    forming a second image in the second region by irradiating visible rays of a second wavelength onto the second region of the film through the second exposure part of the mask and by shifting the first exposure part and the third exposure part of the mask;
    forming a third image in the second region by irradiating visible rays of a third wavelength onto the third region of the film through the third exposure part of the mask, wherein the fourth region of the film between each of the first region, second region and third region is not irradiated by the visible rays, is formed of a black matrix; and forming film-type color filter layers by developing the film having the first, the second and the third images, wherein the first, the second and the third images are on the same plane, wherein the film-type color filter has a flat surface.

2. The method of claim 1, wherein the film has a positive characteristics.

3. The method of 2, wherein the visible rays of the first, second and third wavelengths correspond to red R, green G and blue B colors, respectively.

4. The method of claim 1, wherein the film has a negative characteristics.

5. The method of claim 4, wherein the visible rays of the first, second and third wavelengths correspond to cyan C, magenta M and yellow Y, respectively.

6. The method of claim 1, further comprising:

forming a common electrode on the film-type color filter layer.

7. The method of claim 1, further comprising:

adhering the film-type color filter layer on a substrate, after forming the film-type color filter layer.

8. The method of claim 1, wherein the film is adhered on a substrate, before positioning the mask above the film.

9. The method of claim 1, wherein a height of the film-type color filter and a height of the black matrix are substantially same.

* * * * *